(12) United States Patent
Fan et al.

(10) Patent No.: US 11,539,395 B2
(45) Date of Patent: Dec. 27, 2022

(54) HIGH-VOLTAGE PULSE GENERATOR AND COMMUNICATION METHOD THEREFOR

(71) Applicant: SUZHOU POWERSITE ELECTRIC CO., LTD., Suzhou (CN)

(72) Inventors: Shengfang Fan, Suzhou (CN); Xiaosen Chen, Suzhou (CN); Fei Chen, Suzhou (CN); Jianwei Hao, Suzhou (CN); Wanquan Wang, Suzhou (CN)

(*) Notice: Subject to any disclaimer, the term of this patent is extended or adjusted under 35 U.S.C. 154(b) by 0 days.

(21) Appl. No.: 17/311,116

(22) PCT Filed: Nov. 12, 2019

(86) PCT No.: PCT/CN2019/117359
§ 371 (c)(1),
(2) Date: Jun. 4, 2021

(87) PCT Pub. No.: WO2020/114208
PCT Pub. Date: Jun. 11, 2020

(65) Prior Publication Data
US 2022/0045716 A1 Feb. 10, 2022

(30) Foreign Application Priority Data
Dec. 5, 2018 (CN) .......................... 201811483141.8

(51) Int. Cl.
*H04B 3/06* (2006.01)
*H03K 3/01* (2006.01)

(52) U.S. Cl.
CPC ................ *H04B 3/06* (2013.01); *H03K 3/01* (2013.01)

(58) Field of Classification Search
CPC .. H03K 3/53; H03K 3/01; H03K 3/02; H02M 1/00; H04B 3/06
See application file for complete search history.

(56) References Cited

U.S. PATENT DOCUMENTS

| 5,142,623 A | 8/1992 | Staab et al. |
| 6,674,817 B1 | 1/2004 | Dolle et al. |

(Continued)

FOREIGN PATENT DOCUMENTS

| CN | 1038739 A | 1/1990 |
| CN | 1270460 A | 10/2000 |

(Continued)

OTHER PUBLICATIONS

Office Action of JP2021-532133, dated Jul. 5, 2022.
Office Action of EP19893174.3-1205, dated Sep. 9, 2022.

*Primary Examiner* — David S Huang

(57) ABSTRACT

Disclosed are a high-voltage pulse generator and a communication method therefor. The high-voltage pulse generator comprises a master controller and a sub-controller. Data transmitted between the master controller and the sub-controller at least comprise a first class of data and a second class of data, and, the second class of data at least comprise two types. The communication method comprises the following steps: during the present instance of transmitting a first class of data, transmitting partial types of a second class of data; during the next instance of transmitting the first class of data, transmitting other types of second class of data; and repeatedly executing the step until the transmission of all types of second class of data is completed. The present application ensures an increased real time performance in the transmission of the first class of data; moreover, controller pin resources occupied are reduced, costs are reduced, and the problem of data conflict is avoided.

9 Claims, 7 Drawing Sheets

(56) References Cited

U.S. PATENT DOCUMENTS

| | | | |
|---|---|---|---|
| 8,020,065 B1* | 9/2011 | Gaur | ................... H04L 27/3416 |
| | | | 714/755 |
| 11,146,250 B2 | 10/2021 | Fan et al. | |
| 2003/0099122 A1 | 5/2003 | Cho | |
| 2008/0186885 A1 | 8/2008 | Athalye et al. | |
| 2010/0066340 A1 | 3/2010 | Delforge | |
| 2015/0357822 A1 | 12/2015 | Yokokawa et al. | |
| 2017/0244648 A1* | 8/2017 | Tse | ..................... H04N 21/2365 |
| 2020/0350896 A1 | 11/2020 | Fan et al. | |

FOREIGN PATENT DOCUMENTS

| | | |
|---|---|---|
| CN | 1421838 A | 6/2003 |
| CN | 101047589 A | 10/2007 |
| CN | 101895417 A | 11/2010 |
| CN | 106160987 A | 11/2016 |
| CN | 107809184 A | 3/2018 |
| CN | 109687851 A | 4/2019 |
| EP | 3719987 A1 | 7/2020 |
| JP | 1987225049 A | 10/1987 |
| JP | 2010515407 A1 | 5/2010 |
| JP | 2011223385 A | 11/2011 |
| JP | 2021505120 A | 2/2021 |
| WO | 2012128220 A1 | 9/2012 |
| WO | 2018105047 A1 | 12/2016 |

* cited by examiner

| A1+A2+B1 | A1+A2+B2 | A1+A2+B3 | A1+A2+B1 | A1+A2+B2 |

FIG. 2B

| A1+B1 | A2+B2 | A1+B3 | A2+B1 | A1+B2 | A2+B3 | A1+B1 | A1+B2 |

FIG. 2C

HIGH-VOLTAGE PULSE GENERATOR AND COMMUNICATION METHOD THEREFOR

TECHNICAL FIELD

The present application relates to the technical field of high-voltage pulse generators, and in particular to a high-voltage pulse generator and a communication method therefor.

BACKGROUND

High-voltage pulse technology refers to the rapid release of energy after a relatively long time of storage, thus producing high-voltage pulses. Energy storage capacitors and voltage control circuits are necessary components of high-voltage pulse generators, after other circuits have stored energy for a long time on the energy storage capacitor, the voltage control circuit controls the discharge of the energy storage capacitors to obtain voltage pulses. A voltage control circuit usually consists of a number of controllable switches (such as MOSFETs) to form a control circuit in the form of an H-bridge, etc., and these controllable switches are controlled by the sub-controller corresponding to the voltage control circuit. The high-voltage pulse generator usually also includes a master controller, which communicates with the sub-controllers in real time, and is configured to control the high-voltage generator on the whole to generate predetermined high-voltage pulses. The sub-controller obtains relevant data (For example, including carrier signal data, voltage of energy storage capacitor, start/stop command, reset command, pulse frequency, pulse number, pulse polarity, etc.) from the master controller, and controls the corresponding voltage control circuit to discharge in accordance with specified parameters according to the relevant data.

There can be three existing methods for real time data communication between the master controller and the master controllers. Method 1: one transmission line is used between the master controller and the sub-controllers, and when there is data to be transmitted, the line is used for transmission. This method is often prone to data conflict, for example, when there are two types of data need to occupy the line for transmission at the same time, one of the data must be ignored (This can cause a failure by losing critical data), or one of the two types of data must be delayed to be transmitted (Because high-voltage pulse transmitters have particularly high requirements for real time performance, this delay will cause the final pulse waveform to be unsatisfactory). Method 2: one transmission line is used between the master controller and the sub-controllers, and all data is transmitted to the sub-controller on a regular basis.

Since there are many types of data to be transmitted between the master controller and the sub-controllers, but the control system of the high-voltage generator has different real time requirements for different types of data, the data communication method of method 2 will cause the data transmission speed with high real time requirements to be too slow, which leads to the unsatisfactory final pulse waveform. Method 3: multiple transmission lines are used between the master controller and the sub-controllers, and data is transmitted through multiple lines. This method needs to maintain multiple transmission lines between the master controller and the sub-controllers, occupying the controller pin resources, and each line must ensure its transmission reliability, and the cost is relatively high.

SUMMARY OF THE INVENTION

In view of this, the embodiments of the present application provide a high-voltage pulse generator and a communication method therefor to solve the problem of data conflict, slow data transmission speed with high real time requirements, occupying controller pin resources and high cost in the prior art.

According to the first aspect, the embodiments of the present application provide a communication method for a high-voltage pulse generator, the high-voltage pulse generator comprises a master controller and a sub-controller; data transmitted between the master controller and the sub-controller at least comprise a first class of data and a second class of data, and the second class of data at least comprise two types, the high-voltage pulse generator has higher requirements for real time performance of the first class of data than the second class of data; the method comprises the following steps during a present instance of transmitting the first class of data, transmitting partial types of the second class of data; and during a next instance of transmitting the first class of data, transmitting the other types of the second class of data; and repeatedly executing the step until the transmission of all types of the second class of data is completed.

Alternatively, during each instance of transmitting the first class of data, all types of the first class of data are transmitted.

Alternatively, during each instance of transmitting the first class of data, partial types of the first class of data are transmitted; and the number M of instances of transmission required for transmitting all types of the first class of data is less than the number N of instances of transmission required for transmitting all types of the second class of data; before the transmission of all types of the second class of data is completed, the transmission of all types of the first class of data is completed.

Alternatively, during each instance of transmission, the first class of data and the second class of data to be transmitted are combined into a data packet for transmission.

Alternatively, the high-voltage pulse generator comprises at least two charge and discharge control circuits, each charge and discharge control circuit is correspondingly provided with one sub-controller, and the data packet also comprises an identifier of the sub-controller.

Alternatively, the first class of data comprises at least one of the following data: modulation wave, capacitor voltage, start-stop command, reset command.

Alternatively, the second class of data comprises at least one of the following data: pulse frequency, pulse number, pulse polarity.

According to the second aspect, the embodiments of the present application provide a communication method for a high-voltage pulse generator, the high-voltage pulse generator comprises a master controller and a sub-controller; data transmitted between the master controller and the sub-controller at least comprise a first class of data and a second class of data, and the second class of data at least comprise two types, the high-voltage pulse generator has higher requirements for real time performance of the first class of data than the second class of data; the method comprises the following steps during a present instance of receiving the first class of data, receiving partial types of the second class of data; and during a next instance of receiving the first class of data, receiving the other types of the second class of data; and repeatedly executing the step until the reception of all types of the second class of data is completed.

According to the third aspect, the embodiments of the present application provide a controller, which is configured to execute the communication method described in the first aspect, the second aspect, or any one of the alternative embodiments thereof.

According to the fourth aspect, the embodiments of the present application provide a high-voltage pulse generator adopting the above-mentioned communication method, comprising: a master controller and a sub-controller, which are in communication connection; the master controller is configured to control a high-voltage generator to generate a predetermined high-voltage pulse on the whole; the sub-controller is configured to receive data from the master controller, and control a corresponding voltage control circuit according to the data to discharge in accordance with parameters specified by the data; a transformer, having at least one high-voltage side coil; at least one AC/DC converter, with one side connected to both ends of the high-voltage side coil.

Alternatively, optical fiber communication is adopted between the master controller and the sub-controller.

In the high-voltage pulse generator and the communication method therefor provided in the embodiments of the present application, since there are fewer types of data transmitted during each instance, the time spent for transmitting data during each instance is shorter than that of the prior art, therefore, the communication method provided in these embodiments can transmit data more times at the same time. That is to say, the transmission interval of the first class of data is shorter and the transmission rate is higher, thus it can ensure an increased real time performance in the transmission of the first class of data. Moreover, the communication method provided in these embodiments can be realized by one transmission line, controller pin resources occupied are reduced, costs are reduced, and the problem of data conflict is avoided.

BRIEF DESCRIPTION OF THE DRAWINGS

In order to more clearly illustrate the technical solutions in the specific embodiments of the present application or in the prior art, the accompanying drawings used in describing the specific embodiments or the prior art will be briefly introduced below, and apparently, the accompanying drawings mentioned in the following description are just some embodiments of the present application, and other drawings can be derived by a person skilled in the art from these drawings without expenditure of creative efforts.

FIG. 2A shows a schematic diagram of transmitting data in an existing communication method;

FIG. 2B shows a schematic diagram of transmitting data in a communication method for a high-voltage pulse generator according to an embodiment of the present application;

FIG. 2C shows a schematic diagram of transmitting data according to another communication method for a high-voltage pulse generator according to another embodiment of the present application;

DETAILED DESCRIPTION OF EMBODIMENTS

The technical solutions of the present application will be described clearly and completely with reference to the accompanying drawings, and apparently, the described embodiments are only a part of, but not all of, the embodiments of the present application. All other embodiments obtained by a person skilled in the art based on the embodiments described in the present application without expenditure of creative efforts belong to the protection scope of the present application.

Embodiment 1

Figure 1A:
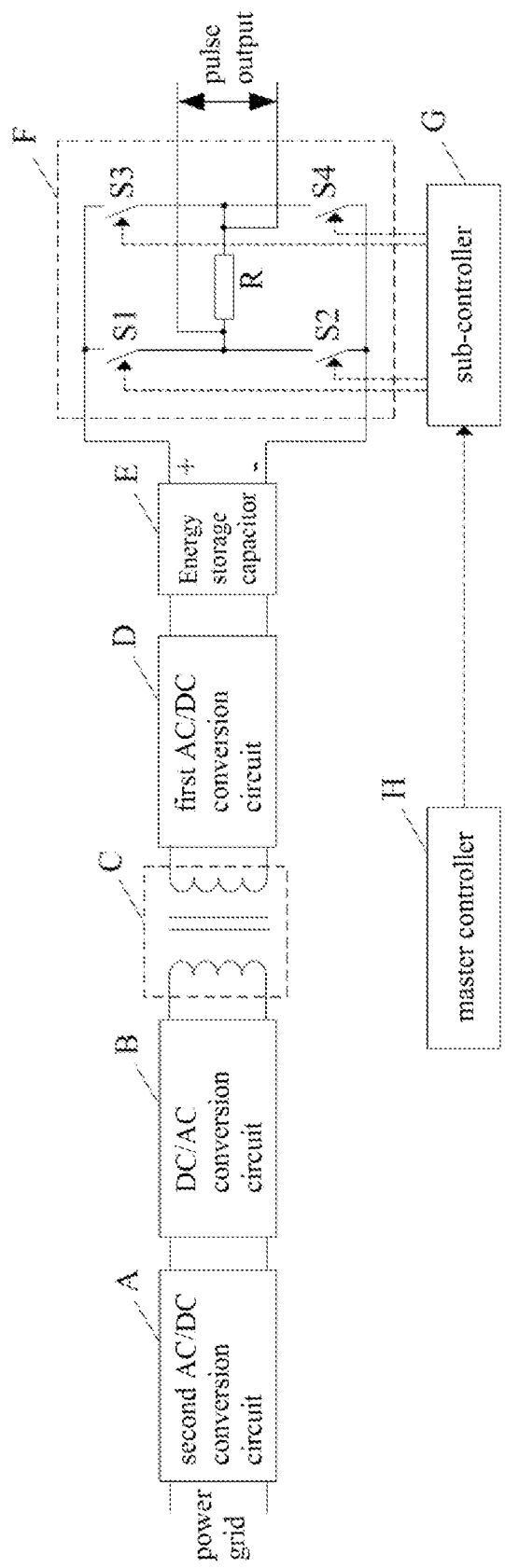
FIG. 1A shows a schematic structural diagram of a high-voltage pulse generator according to an embodiment of the present application.
Figure 3:
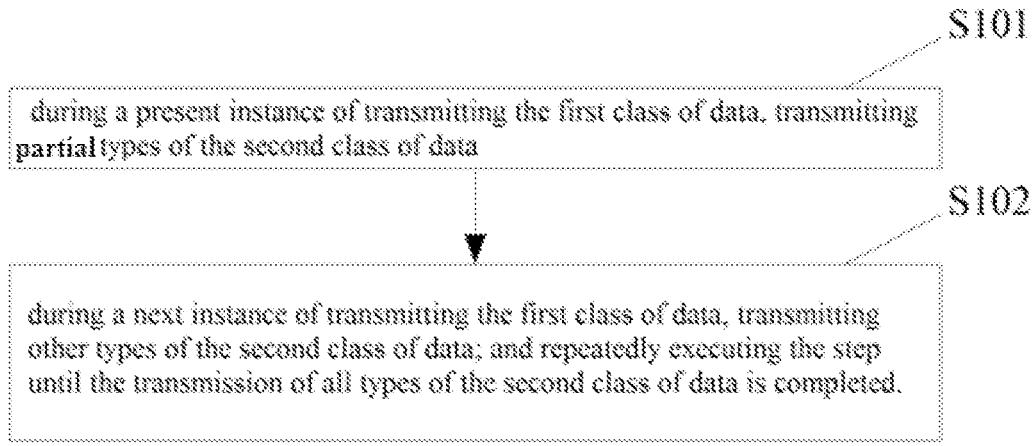
FIG. 3 shows a flow chart of a communication method for a high-voltage pulse generator according to an embodiment of the present application.

FIG. 3 shows a flow chart of a communication method for a high-voltage pulse generator according to an embodiment of the present application. Wherein, the high-voltage pulse generator comprises a master controller and a sub-controller, as shown in FIG. 1A. This method can be used by the master controller to transmit data to the sub-controller, and it can also be used by the sub-controller to transmit data to the master controller. Data transmitted between the master controller and the sub-controller comprise a first class of data and a second class of data, and the second class of data at least comprise two types, the high-voltage pulse generator has higher requirements for real time performance of the first class of data than the second class of data. As shown in FIG. 3, the communication method comprises the following steps:

S101: During a present instance of transmitting the first class of data, transmitting partial types of the second class of data;

S102: During a next instance of transmitting the first class of data, transmitting other types of the second class of data; and repeatedly executing the step until the transmission of all types of the second class of data is completed.

Figure 2A:
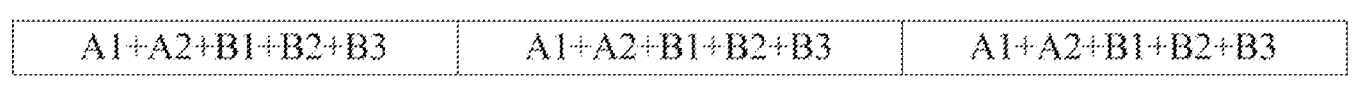
Figure 2B:
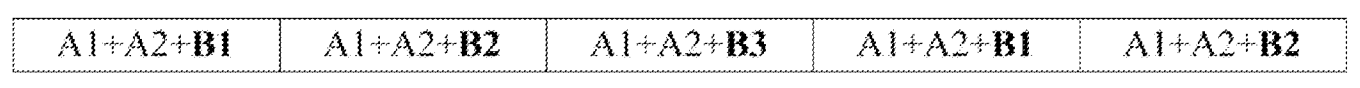

For example, the first class of data comprises two types: A1, A2, and the second class of data comprises three types of data B1, B2, and B3. As shown in FIG. 2A and FIG. 2B, each grid represents transmitting data once, FIG. 2A shows a schematic diagram of transmitting data in an existing communication method, for example, all of the data A1, A2, B1, B2, and B3 are transmitted during the first instance (transmitting one type of data each instance), and also all of the data A1, A2, B1, B2, and B3 are transmitted during the second instance, and also all of the data A1, A2, B1, B2, and B3 are transmitted during the third instance . . . ; FIG. 2B shows a schematic diagram of transmitting data in a communication method for a high-voltage pulse generator according to an embodiment of the present application, for example: all the data of A1, A2, and B1 are transmitted during the first instance, all the data of A1, A2, and B2 are transmitted during the second instance, all the data A1, A2, and B3 are transmitted during the third instance, all the data A1, A2, and B1 are transmitted during the fourth instance, all the data A1, A2, and B2 are transmitted during the fifth instance, and all the data of A1, A2, and B3 are transmitted during the sixth instance . . . .

As can be seen from FIG. 2A and FIG. 2B, since the communication method provided by the present embodiment transmits fewer types of data during each instance, the time spent for transmitting data during each instance is shorter than that of the prior art, therefore, the communication method provided in these embodiments can transmit data more times at the same time. That is to say, the transmission interval of the first class of data is shorter and the transmission rate is higher, thus it can ensure an increased real time performance in the transmission of the first class of data. Moreover, the communication method provided in these embodiments can be realized by one transmission line, controller pin resources occupied are reduced, costs are reduced, and the problem of data conflict is avoided.

It should be supplemented that, during above-mentioned transmission each instance, multiple types of data can be transmitted one by one, or the data to be transmitted (comprising the first class of data and the second class of data) can be combined into a data packet for transmission. The present embodiment does not limit the specific method of transmission each instance.

Figure 2C:
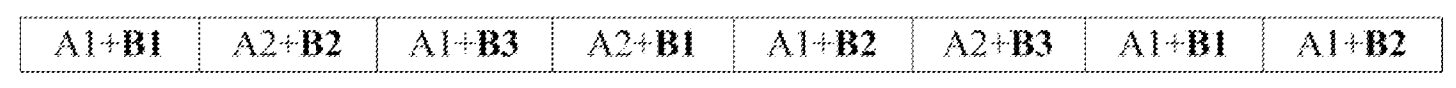

It should be supplemented that, in the steps S101 and S102, "transmitting all types of the first class of data" may be transmitting all types of the first class of data during each instance (as shown in FIG. 2B), or it may be transmitting partial types of the first class of data during each instance, as long as it is guaranteed that "the number M of instances of transmission required for transmitting all types of the first class of data is less than the number N of instance of transmission required for transmitting all types of the second class of data; and before the transmission of all types of the second class of data is completed, the transmission of all types of the first class of data is completed". For example, as shown in FIG. 2C, data A1 and B1 are transmitted during the first instance, data A2 and B2 are transmitted during the second instance, data A1 and B3 are transmitted during the third instance, data A2 and B1 are transmitted during the fourth instance, data A1 and B2 are transmitted during the fifth instance, data A2 and B3 are transmitted during the sixth instance, data A1 and B1 are transmitted during the seventh instance, data A2 and B2 are transmitted during the eighth instance, and data A1 and B3 are transmitted during the ninth instance . . . . Compared with the communication method shown in FIG. 2B, this communication method further reduces the number of the types of data transmitted during each instance, and further reduces the time spent in one transmission.

Embodiment 2

Figure 4:
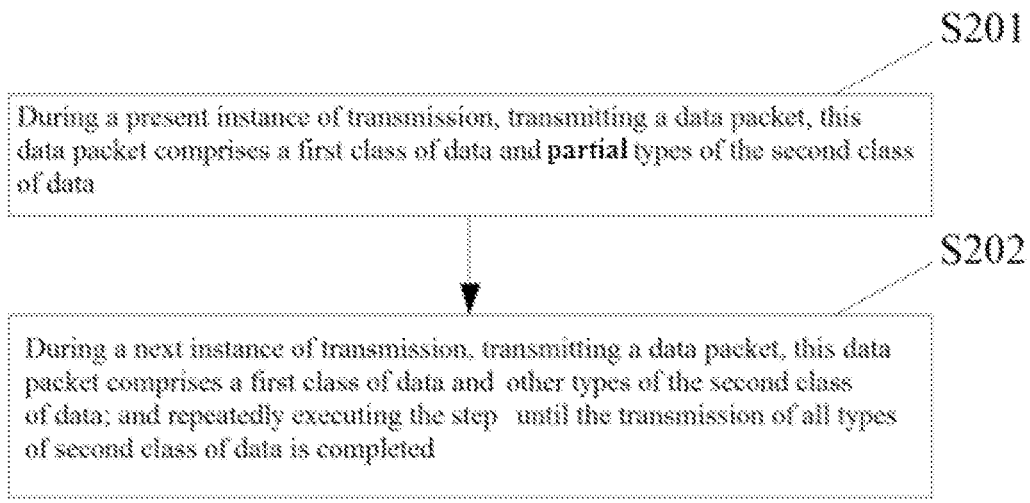
FIG. 4 shows a flow chart of another communication method for a high-voltage pulse generator according to another embodiment of the present application.

FIG. 4 shows a flow chart of another communication method for a high-voltage pulse generator according to an embodiment of the present application. Wherein, the high-voltage pulse generator comprises a master controller and a sub-controller; data transmitted between the master controller and the sub-controller comprise a first class of data and a second class of data, and the second class of data at least comprise two types, the high-voltage pulse generator has higher requirements for real time performance of the first class of data than the second class of data. As shown in FIG. 4, the communication method comprises the following steps:

S201: During a present instance of transmission, transmitting a data packet which comprises a first class of data and partial types of the second class of data.

S201: During a next instance of transmission, transmitting a data packet which comprises a first class of data and some other types of the second class of data; and repeatedly executing the step until the transmission of all types of second class of data is completed.

The embodiment further defines: during each instance of transmission, the first class of data and the second class of data are combined into a data packet for transmission. The details can be referred to Embodiment 1.

It should be supplemented that each data packet may comprise all the types of first class of data, or partial types of first class of data. The details can be referred to embodiment 1.

As an alternative implantation of the present embodiment, the data packet further comprises a check code, such as a CRC check code, which is used by the receiver to check whether the data packet is transmitted incorrectly.

Figure 1B:
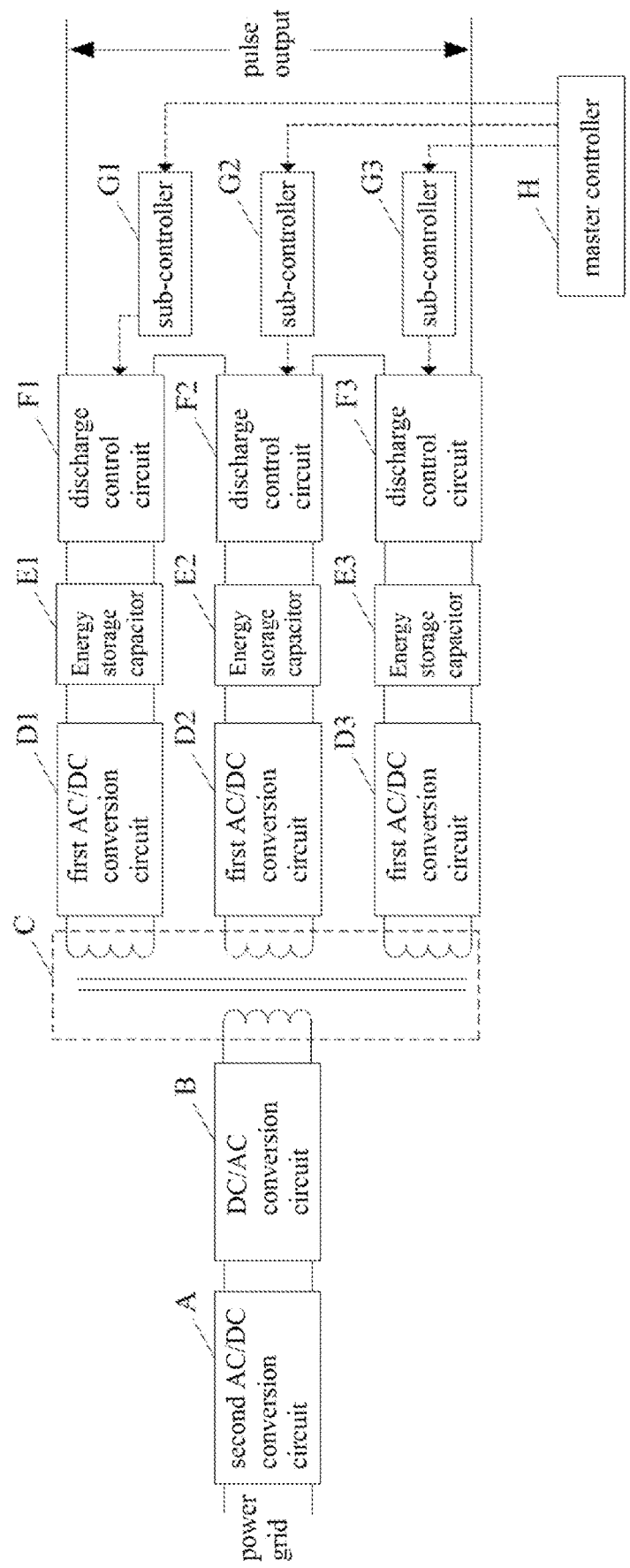
FIG. 1B shows a schematic structural diagram of another high-voltage pulse generator according to another embodiment of the present invention.

As an alternative implantation of the present embodiment, the high-voltage pulse generator comprises at least two discharge control circuits, and each discharge control circuit is correspondingly provided with one sub-controller, as shown in FIG. 1B. Accordingly, the data packet also comprises an identifier of the sub-controller, which is used by the sender to identify whether the data packet is transmitted to the correct sub-controller, and/or the receiver to identify whether a certain data packet should be received, especially, when bus communication is used between the master controller and each sub-controller.

Alternatively, the first class of data in the embodiment 1, the embodiment 2, or any one of its alternative embodiments comprises at least one of the following data: modulation wave, capacitor voltage, start-stop command, reset command, the second class of data in the embodiment 1, the embodiment 2, or any one of its alternative embodiments comprises at least one of the following data: pulse frequency, pulse number, pulse polarity. Compared with the second class of data, the high-voltage generator has higher degree of real time requirements for the first class of data.

Embodiment 3

Figure 5:
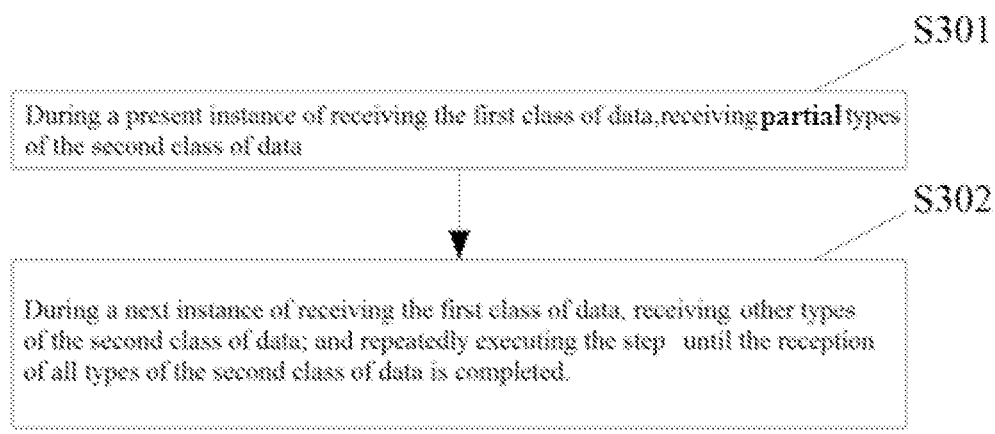
FIG. 5 shows a flow chart of yet another communication method for a high-voltage pulse generator according to another embodiment of the present application.

FIG. 5 shows a flow chart of another communication method for a high-voltage pulse generator according to an embodiment of the present application. Wherein, the high-voltage pulse generator comprises a master controller and a sub-controller, as shown in FIG. 1A.

This method can be used by the master controller to transmit data to the sub-controller, and it can also be used by the sub-controller to transmit data to the master controller. Data transmitted between the master controller and the sub-controller at least comprise a first class of data and a second class of data, and the second class of data at least comprise two types, the high-voltage pulse generator has higher requirements for real time performance of the first class of data than the second class of data. As shown in FIG. 5, the communication method comprises the following steps:

S301: During a present instance of receiving the first class of data, receiving partial types of the second class of data;

S302: During a next instance of receiving the first class of data, receiving other types of the second class of data; and repeatedly executing the step until the reception of all types of the second class of data is completed.

The communication method provided in the present embodiment is a method executed by the receiver corresponding to the embodiment 1, the embodiment 2, or any one of the alternative embodiments thereof, which ensures an increased real time performance in the transmission of the first class of data; moreover, controller pin resources occupied are reduced, costs are reduced, and the problem of data conflict is avoided. The details can be referred to embodiment 1.

Embodiment 4

The embodiment of the present application provides a controller for executing the communication method described in the embodiment 1, the embodiment 2 or the embodiment 3, or any one of the alternative embodiments thereof. It can be a master controller in the high-voltage generator shown in FIG. 1A and FIG. 1B, or it can be a sub-controller among them.

Embodiment 5

FIG. 1A shows a schematic structural diagram of a high-voltage pulse generator according to an embodiment of the present application;

The high-voltage generator adopts the communication method described in Embodiment 1, Embodiment 2, or Embodiment 3, or any one of the alternative embodiments thereof. As shown in FIG. 1A and FIG. 1B, the high-voltage generator comprises a master controller H, a sub-controller G, a transformer C, at least one AC/DC converter D, at least one capacitor E and at least one voltage control circuit F.

The master controller H is configured to control a high-voltage generator to generate a predetermined high-voltage pulse on the whole, the sub-controller G is configured to receive data from the master controller H, and control a corresponding voltage control circuit F according to the data to discharge in accordance with parameters specified by the data. The master controller and the sub-controller are in communication connection. The transformer has at least one high-voltage side coil. One side of the AC/DC converter D is connected to both ends of the high-voltage side coil. Both ends of the capacitor E are connected to the other side of the AC/DC converter D. One side of the voltage control circuit F is connected to both ends of the capacitor, and the other side is configured to output pulse voltage.

Alternatively, optical fiber communication is adopted between the master controller H and the sub-controller G.

Alternatively, at least two ends of the other side of two voltage control circuits F are connected in series, and the two ends in series connection are used as pulse voltage output terminals, as shown in FIG. 1B.

Alternatively, the voltage control circuit is an H-bridge circuit, as shown in FIG. 1A.

Although the embodiments of the present invention have been described in conjunction with the accompanying drawings, those skilled in the art can make various modifications and variations without departing from the spirit and scope of the present application, and such modifications and variations embrace within the scope defined by the appended claims.

The invention claimed is:

1. A communication method for a high-voltage pulse generator, which comprises a master controller and a sub-controller, with data transmitted between the master controller and the sub-controller at least comprising a first class of data and a second class of data, and the second class of data at least comprising two types, and the high-voltage pulse generator has higher requirements for real time performance of the first class of data than the second class of data;

wherein, the method comprises the following steps during a present instance of transmitting the first class of data, transmitting partial types of the second class of data; and during a next instance of transmitting the first class of data, transmitting other types of the second class of data; and repeatedly executing the step until the transmission of all types of the second class of data is completed, during each instance of transmitting the first class of data, transmitting all types of the first class of data.

2. The communication method for a high-voltage pulse generator according to claim 1, wherein, the number M of instances of transmission required for transmitting all types of the first class of data is less than the number N of instance of transmission required for transmitting all types of the second class of data; before the transmission of all types of the second class of data is completed, the transmission of all types of the first class of data is completed.

3. The communication method for a high-voltage pulse generator according to claim 1, wherein, during each instance of transmission, the first class of data and the second class of data to be transmitted are combined into a data packet for transmission.

4. The communication method for a high-voltage pulse generator according to claim 3, wherein, the high-voltage pulse generator comprises at least two charge and discharge control circuits, each charge and discharge control circuit is correspondingly provided with one sub-controller, and the data packet also comprises an identifier of the sub-controller.

5. The communication method for a high-voltage pulse generator according to claim 1, wherein, the first class of data comprises at least one of the following data: modulation wave, capacitor voltage, start-stop command, and reset command.

6. The communication method for a high-voltage pulse generator according to claim 1, wherein, the second class of data comprises at least one of the following data: pulse frequency, pulse number, pulse polarity.

7. A controller, configured to execute the communication method according to claim 1.

8. A high-voltage pulse generator adopting the communication method according to claim 1, comprising:
a master controller and a sub-controller, which are in communication connection;
wherein, the master controller is configured to control a high-voltage generator to generate a predetermined high-voltage pulse; the sub-controller is configured to receive data from the master controller and control a corresponding voltage control circuit according to the data to discharge in accordance with parameters specified by the data;
a transformer, having at least one high-voltage side coil;
at least one AC/DC converter, with one side connected to both ends of the high-voltage side coil;
at least one capacitor, with both ends connected to the other side of the AC/DC converter;
at least one voltage control circuit, with one side connected to both ends of the capacitor, and the other side configured to output pulse voltage.

9. A communication method for a high-voltage pulse generator, which comprises a master controller and a sub-controller, with data transmitted between the master controller and the sub-controller at least comprise a first class of data and a second class of data, the second class of data at least comprise two types, the high-voltage pulse generator has higher requirements for real time performance of the first class of data than the second class of data;
  wherein, the method comprises the following steps:
  during a present instance of receiving the first class of data, receiving partial types of the second class of data;
  during a next instance of receiving the first class of data, receiving other types of the second class of data; and repeatedly executing the steps until the reception of all types of the second class of data is completed,
  during each instance of receiving the first class of data, receiving all types of the first class of data.

* * * * *